United States Patent
Mellies et al.

(10) Patent No.: US 8,969,275 B2
(45) Date of Patent: Mar. 3, 2015

(54) AQUEOUS ALKALINE CLEANING COMPOSITIONS AND METHODS OF THEIR USE

(75) Inventors: Raimund Mellies, Dieburg (DE); Andreas Klipp, Lambsheim (DE)

(73) Assignee: BASF SE, Ludwigshafen (DE)

( * ) Notice: Subject to any disclaimer, the term of this patent is extended or adjusted under 35 U.S.C. 154(b) by 215 days.

(21) Appl. No.: 13/380,071

(22) PCT Filed: Jun. 24, 2010

(86) PCT No.: PCT/EP2010/058959
§ 371 (c)(1),
(2), (4) Date: Dec. 22, 2011

(87) PCT Pub. No.: WO2011/000758
PCT Pub. Date: Jan. 6, 2011

(65) Prior Publication Data
US 2012/0094886 A1    Apr. 19, 2012

Related U.S. Application Data

(60) Provisional application No. 61/221,693, filed on Jun. 30, 2009.

(51) Int. Cl.
| | |
|---|---|
| *C11D 3/00* | (2006.01) |
| *C11D 3/20* | (2006.01) |
| *C11D 11/00* | (2006.01) |
| *C11D 7/32* | (2006.01) |
| *C11D 3/02* | (2006.01) |
| *C11D 1/12* | (2006.01) |
| *C11D 1/62* | (2006.01) |
| *C11D 3/34* | (2006.01) |
| *C11D 7/34* | (2006.01) |
| *G03F 7/42* | (2006.01) |
| *H01L 21/02* | (2006.01) |

(52) U.S. Cl.
CPC .. *C11D 1/62* (2013.01); *C11D 3/34* (2013.01); *C11D 7/3209* (2013.01); *C11D 7/34* (2013.01); *C11D 11/0047* (2013.01); *G03F 7/425* (2013.01); *H01L 21/02074* (2013.01)
USPC .......... 510/163; 510/109; 510/167; 510/175; 510/179; 510/489

(58) Field of Classification Search
USPC .............. 510/163, 179, 109, 167, 489, 175
See application file for complete search history.

(56) References Cited

U.S. PATENT DOCUMENTS

| | | |
|---|---|---|
| 2005/0181961 A1 | 8/2005 | Misra et al. |
| 2006/0166847 A1* | 7/2006 | Walker et al. ............... 510/175 |
| 2007/0225186 A1 | 9/2007 | Fisher |
| 2007/0235061 A1* | 10/2007 | Mizuta et al. ................ 134/2 |
| 2008/0047592 A1 | 2/2008 | Fisher et al. |
| 2008/0138972 A1 | 6/2008 | Kang et al. |
| 2011/0046314 A1 | 2/2011 | Klipp et al. |
| 2011/0059611 A1 | 3/2011 | Mellies |
| 2011/0076416 A1 | 3/2011 | Klipp et al. |

FOREIGN PATENT DOCUMENTS

| | | | |
|---|---|---|---|
| CN | 1087509 | 12/2006 | |
| CN | 101410503 | 4/2009 | |
| EP | 2 028 262 | 2/2009 | |
| GB | 1 479 597 | 7/1977 | |
| JP | WO2005040324 | * 6/2005 | ............ C11D 11/00 |
| WO | 2005 085408 | 9/2005 | |
| WO | 2007 110719 | 10/2007 | |
| WO | 2010 127941 | 11/2010 | |
| WO | 2011 000694 | 1/2011 | |

OTHER PUBLICATIONS

International Search Report issued on Sep. 29, 2010 in PCT/EP10/058959 filed on Jun. 24, 2010.
U.S. Appl. No. 13/145,257, filed Jul. 22, 2011, Klipp, et al.
U.S. Appl. No. 61/176,179, filed May 7, 2009, Klipp.
U.S. Appl. No. 13/319,187, filed Nov. 7, 2011, Klipp.
U.S. Appl. No. 61/176,165, filed May 7, 2009, Klipp.
U.S. Appl. No. 13/265,647, filed Oct. 21, 2011, Klipp.

\* cited by examiner

*Primary Examiner* — Ling Choi
*Assistant Examiner* — Thuy-Al Nguyen
(74) *Attorney, Agent, or Firm* — Oblon, McClelland, Maier Neustadt, L.L.P.

(57) ABSTRACT

The aqueous alkaline cleaning composition comprising (A) at least one thioamino acid having at least one secondary or tertiary amino group and at least one mercapto group and (B) at least one quaternary ammonium hydroxide; the use of the alkaline cleaning composition for the processing of substrates useful for fabricating electrical and optical devices; and a method for processing substrates useful for fabricating electrical and optical devices making use of the said aqueous alkaline cleaning composition.

25 Claims, No Drawings

AQUEOUS ALKALINE CLEANING COMPOSITIONS AND METHODS OF THEIR USE

This application is a National Stage of PCT/EP10/058,959 filed Jun. 24, 2010 and claims the benefit of U.S. 61/221,693 filed Jun. 30, 2009.

FIELD OF THE INVENTION

The present invention relates to new aqueous alkaline cleaning compositions for processing substrates useful for fabricating electrical and optical devices, in particular electrical devices, including compositions useful for surface preparation, pre-plaiting cleaning, post-etch cleaning and post-chemical mechanical polishing cleaning.

Moreover, the present invention relates to new methods for processing substrates useful for fabricating electrical and optical devices, in particular electrical devices, including new methods for surface preparation, pre-plaiting cleaning, post-etch cleaning and post-chemical polishing cleaning, which new methods make use of the new aqueous alkaline cleaning compositions.

DESCRIPTION OF THE PRIOR ART

The fabrication of electrical devices, in particular, semiconductor integrated circuits (ICs); liquid crystal panels; organic electroluminescent panels; printed circuit boards; micro machines; DNA chips; micro plants and magnetic heads; preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; requires high precision methods which involve inter alia surface preparation, pre-plaiting cleaning, post-etch cleaning and/or post-chemical polishing cleaning steps using high-purity cleaning compositions.

Particular care has to be taken in the fabrication of ICs with LSI or VLSI. The semiconductor wafers used for this purpose include a semiconductor substrate such as silicon, into which regions are patterned for the deposition of different materials having electrically insulative, conductive or semiconductive properties.

In order to obtain the correct patterning, excess material used in forming the various layers on the substrates must be removed. Further, to fabricate functional and reliable ICs, it is important to have flat or planar semiconductor wafer surfaces. Thus, it is necessary to remove and/or polish certain surfaces of a semiconductor wafers during the fabrication of the ICs before carrying out the next process steps.

Chemical Mechanical Polishing or Planarization (CMP) is a process in which material is removed from a substrate surface, as for example, the surface of a semiconductor wafer, and the surface is polished (planarized) by coupling a physical process such as abrasion with a chemical process such as oxidation or chelation. In its most rudimentary form, CMP involves applying a slurry, i.e. a suspension of an abrasive and an active chemistry, to a polishing pad that buffs the surface of a semiconductor wafer to achieve the removal, planarization and polishing. It is not desirable for the removal or polishing to be comprised of purely physical or purely chemical action, but rather the synergistic combination of both in order to achieve a fast uniform removal. In the fabrication of ICs, the CMP slurry should also be able to preferentially remove films that comprise complex layers of metals and other materials so that highly planar surfaces can be produced for subsequent photolithography, patterning, etching and thin-film processing.

Nowadays, copper is increasingly used for metal interconnects in ICs. In the copper damascene or dual damascene process commonly used for the metallization of circuitry in the semiconductor fabrication, the layers that must be removed and planarized include copper layers having a thickness of about 1-1.5 µm and copper seed layers having a thickness of about 0.05-0.15 µm. These copper layers are separated from the low-k and ultra low-k dielectric material by a layer of barrier material, typically about 5 to 30 nm thick, which prevents diffusion of copper into the low-k or ultra low-k dielectric material. The key to obtaining good uniformity across the wafer surface after polishing is to use a CMP slurry that has the correct removal selectivities for each material.

The foregoing processing operations involving wafer substrate surface preparation, deposition, plating, etching and chemical mechanical polishing variously require cleaning operations to ensure that the ICs are free from contaminants that would otherwise deleteriously affect the function of the ICs, or even render them useless for their intended functions.

One particularly grave issue are the residues that are left on the substrates following CMP processing. Such residues include CMP material and corrosion inhibitor compounds such as benzotriazole (BTA). Thus, the copper ion concentration can exceed the maximum solubility of the copper-inhibitor complexes during CMP. Therefore, the copper-inhibitor complexes can precipitate from solution and can coagulate into a surface residue. Moreover, these residues can stick to the surface of the polishing pad and accumulate to eventually filling the grooves in the polishing pad. Additionally, abrasive particles and chemicals contained in the CMP slurries as well as reaction by-products can be left behind on the wafer surface. Furthermore, the polishing of copper damascene structures containing ultra low-k dielectric materials such as carbon-doped oxides or organic films can generate carbon-rich particles that settle on to the wafer surface. Of course, all these residues can also contaminate the processing tools employed in the process which come into contact with the CMP slurries. To make matters worse these ultra low-k dielectric materials as well as silicon carbide, silicon nitride or silicon oxynitride CMP stop layers are very hydrophobic and hence are difficult to clean with water-based cleaning solutions.

All these residues can cause a severe roughening of the copper metallization, which has to be avoided since this causes a poor electrical performance.

Another residue-producing process common to IC manufacturing involves gasphase plasma etching to transfer the patterns of developed photoresist coatings to the underlying layers, which may consist of hardmask, interleval dielectric and etch-stop layers. Post gasphase plasma etch residues, which may include chemical elements present on and in the substrate and in the plasma gases, are typically deposited on the back end of the line (BEOL) structures and, if not removed, may interfere with the subsequent silicidation and contact formation.

In order to ameliorate these problems at least to a certain extent, aqueous alkaline cleaning and stripping compositions containing quaternary ammonium hydroxides had been developed and were disclosed in the prior art.

Thus, the American U.S. Pat. No. 6,465,403 B1 discloses aqueous alkaline compositions for stripping or cleaning semiconductor wafer substrates which contain inter alia
- bases such as quaternary ammonium hydroxides,
- metal ion-free silicates such as quaternary ammonium silicates,
- metal chelating agents and such as salicylic acid,
- organic solvents such as glycol ethers, and
- non-ionic surfactants such as polyoxyethylene monoalkyl ethers and alkylene glycol monoalkyl ethers.

Moreover, Example 29, column 47, line 10 to column 49, line 8 in conjunction with the Table 28 discloses the solution S8 which consists of
- de-ionized water,
- tetramethylammonium silicate,
- tetramethylammonium hydroxide,
- trans-(1,2-cyclohexylenenitrilo)-tetraacetic acid, and
- cysteine as a potential titanium residue removal enhancer.

However, the test results presented in the Table 28 show that cysteine has no beneficial effect in this regard.

The American U.S. Pat. No. 6,200,947 B1 discloses aqueous alkaline cleaning liquids containing tetraalkylammonium hydroxides and an aliphatic alcohol compound having at least one mercapto group in the molecule as metal-corrosion inhibitor.

The international patent application WO 01/95381 A2 and the American U.S. Pat. No. 6,492,308 B1 disclose a post-CMP cleaning solution comprising inter alia
- quaternary ammonium hydroxides,
- polar organic amines such as ethanolamine, and
- ethylenediamine as corrosion inhibitor.

The American patent application US 2003/0207778 A1, the international patent application WO 03/053602 A1 and the American U.S. Pat. No. 7,387,964 B2 disclose aqueous alkaline copper polishing cleaning compositions containing inter alia complexing agents selected from the group consisting of unidentate alkyl amines such as ethanolamine, bidentate alkyl amines such as ethylenediamine and diethylenetriamine and tridentate amines such as triethylenetetraamine and quaternary ammonium salts such as tetramethylammonium hydroxide.

The American patent application US 2005/0181961 A1 and the American U.S. Pat. No. 7,435,712 B2 disclose potential aqueous alkaline cleaning compositions containing inter alia
- tetraalkylammonium hydroxides as cleaning agents,
- cysteine, ethylenediamine and salicylic acid as complexing agents, and/or
- cysteine as corrosion-inhibiting compound.

The American patent application US 2006/0166847 A1, page 5, paragraphs [0082] and [0083] discloses the aqueous alkaline cleaning composition K containing inter alia
- ethanolamine,
- tetramethylammonium hydroxide and
- cysteine;

and the aqueous cleaning composition M containing inter alia
- ethanolamine,
- tetramethylammonium hydroxide and
- ethylenediamine.

However, as can be taken from page 8, Table 1 in conjunction with paragraph [0161], both compositions exhibit only a poor cleaning efficiency. Moreover, according to page 12, Example 13, paragraph [0198] in conjunction with the FIG. 9, the said aqueous alkaline cleaning compositions also cause a high roughness of the treated copper surfaces.

The international patent application WO 2006/081406 A1, page 20 discloses the same aqueous alkaline cleaning compositions K and M. As follows from Table 1, page 26, paragraph [00122] in conjunction with page 27, paragraph [00123], both compositions exhibit only a poor cleaning efficiency. Additionally, according to page 37, Example 13, paragraph [00171] in conjunction with the FIG. 9, the said aqueous alkaline cleaning compositions also cause a high roughness of the treated copper surfaces. Moreover, the international patent application also discloses on page 26 the aqueous alkaline cleaning composition DF comprising inter alia
- ethanolamine,
- tetramethylammonium hydroxide and
- diethylene glycol hexyl ether.

However, no application properties are disclosed.

The international patent application WO 2006/127885 A1 discloses aqueous alkaline post-CMP cleaning compositions containing inter alia
- amine compounds such as ethanolamine and triethylenediamine,
- quaternary ammonium salts and
- polyalkylene glycol alkyl ethers such as diethylene glycol monobutyl ether as complexing agents.

Page 19 of the international patent application specifically mentions the formulations AM and AQ both containing inter alia
- ethanolamine,
- tetramethylammonium hydroxide and
- diethylene glycol hexyl ether.

However, no experimental details are disclosed.

The prior art aqueous alkaline cleaning or stripping compositions are susceptible to degradation when exposed to oxygen, which in turn results in darkening of the color of the compositions, with the result that sensors associated with the fabrication process tools yield erroneous outputs that can compromise the function and reliability of the tool. Additionally, such degradation involves the loss of cleaning and/or stripping power. This can become so extensive in the case of prolonged oxygen exposure that the cleaning or stripping composition has no longer a significant efficacy.

The prior art discussed above does not offer any hints as to how these problems may be resolved. In particular, it appears that ingredients such as cysteine, ethylenediamine, ethanolamine or polyalkylene glycol ethers at best offer no advantages if they are not altogether disadvantageous as demonstrated by the international patent application WO 2006/081406 A1 or the American patent application US 2006/0166847 A1 discussed above.

As regards cysteine, it is well known in the art that this compound is easily oxidized (cf., for example, Shayne C. Gad, Handbook of Pharmaceutical Biotechnology, John Wiley and Sons, 2007, page 328). Moreover, traces of heavy metals, in particular iron and copper, can decompose cysteine (cf. Römpp Online 2009, "L-cysteine"). Consequently, one would even less so expect that aqueous alkaline cleaning compositions could ameliorate the problems described above.

The prior art discussed above remains completely silent about the derivatives of cysteine. Therefore, the skilled artisan cannot derive any hints at all as to whether the derivatives would exhibit the same or different application properties or could ameliorate the problems discussed above.

The international patent application WO 2005/093031 A1 discloses an improved acidic chemistry for post-CMP cleaning. The acidic cleaning solution is in the neutral to low pH range and comprises a cleaning agent such as cysteine or salicylic acid and a corrosion-inhibiting compound such as cysteine. However, such an acidic chemistry tends to attack metallic surfaces to a much greater extent, in particular in the presence of complexing agents and oxygen. Therefore, the skilled artisan can derive nothing from the international patent application as to how he could increase the undesirably low stability of the alkaline cleaning compositions containing cysteine.

OBJECTS OF THE INVENTION

It was an object of the present invention to provide novel aqueous alkaline cleaning compositions for processing substrates useful for fabricating electrical devices, in particular, semiconductor integrated circuits (ICs); liquid crystal panels; organic electroluminescent panels; printed circuit boards; micro machines; DNA chips, micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks, which fabrication requires high precision methods involving inter alia surface preparation, pre-plaiting cleaning, post-etch cleaning and/or post-CMP cleaning steps using high-purity cleaning compositions.

In particular, the novel aqueous alkaline cleaning compositions should no longer exhibit the disadvantages of the prior art compositions such as discoloration, darkening and decomposition upon exposure to oxygen so that they can be easily prepared, stored, transported, handled and used even after prolonged storage without loss of cleaning and/or stripping power and without causing erroneous outputs of the sensors associated with the fabrication process tools, which outputs can compromise the function and reliability of the tools.

The novel aqueous alkaline cleaning compositions ought to be particularly well-suited for carrying out the above-mentioned cleaning steps, in particular, the post-CMP cleaning of semiconductor wafers during the fabrication of ICs with LSI or VLSI, in particular via the copper damascene or dual damascene process.

The novel aqueous alkaline cleaning compositions ought to remove most efficiently all kinds of residues and contaminants generated during the substrate surface preparation, deposition, plating, etching and CMP to ensure that the substrates, in particular the ICs, are free from residues and contaminants that would otherwise deleteriously affect the functions of the electrical and optical devices, in particular the ICs, or render them even useless for their intended functions. In particular, they should prevent the roughening of the copper metallization in damascene structures.

Moreover, the novel aqueous alkaline cleaning compositions ought to remove most efficiently such residues and contaminants not only from the substrates but also from the fabrication tools which are used in the various processes.

It was another object of the invention to provide novel methods for processing substrates useful for fabricating electrical devices, in particular, semiconductor integrated circuits (ICs); liquid crystal panels; organic electroluminescent panels; printed circuit boards; micro machines; DNA chips; micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks, which novel methods make use of the novel aqueous alkaline cleaning compositions.

In particular, the novel methods for fabricating electrical and optical devices, in particular electrical devices, ought to involve surface preparation, pre-plaiting cleaning, post-etch cleaning and/or post-CMP cleaning steps, more particularly post-etch and/or post-CMP cleaning steps, and, most particularly, post-CMP cleaning steps using the novel aqueous alkaline cleaning compositions.

The novel methods for fabricating electrical devices ought to be particularly well-suited for the fabrication of ICs with LSI or VLSI, especially with the help of the copper damascene and dual damascene process. Regarding the copper damascene and dual damascene process, the novel methods ought to remove contaminants and residues such as particles consisting of or containing copper, copper oxide, copper-inhibitor complexes, abrasives and carbon after the CMP step from the substrate surfaces, the polishing pads and other processing tools most efficiently without scratching, etching and roughening the copper surfaces.

SUMMARY OF THE INVENTION

Accordingly, the novel aqueous alkaline cleaning compositions were found, comprising
(A) at least one thioamino acid having at least one secondary or tertiary amino group and at least one mercapto group and
(B) at least one quaternary ammonium hydroxide.

Hereinafter the novel aqueous alkaline cleaning compositions are referred to as the "compositions of the invention".

Moreover, the novel methods for processing substrates useful for fabricating electrical and optical devices were found, the said methods making use of at least one composition of the invention in at least one process step.

Hereinafter the novel methods for processing substrates useful for fabricating electrical and optical devices are referred to as the "methods of the invention".

Last but not least, the novel use of the of the composition of the invention for the processing of substrates useful for fabricating electrical and optical devices has been found.

ADVANTAGES OF THE INVENTION

In view of the prior art discussed above, it was surprising and could not be expected by the skilled artisan that the objects underlying the present invention could be solved by the compositions and the methods of the invention.

It was particularly surprising that the compositions of the invention were excellently suited for processing substrates useful for fabricating electrical devices, in particular, semiconductor integrated circuits (ICs); liquid crystal panels; organic electroluminescent panels; printed circuit boards; micro machines; DNA chips; micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators;

solid laser monocrystals; sapphire substrates for blue laser LEDs; semiconductor monocrystals; and glass substrates for magnetic disks.

It was even more surprising that the compositions of the invention were most excellently suited for high precision fabrication methods involving inter alia surface preparation, pre-plaiting cleaning, post-etch cleaning and/or post-CMP cleaning steps.

The compositions of the invention themselves no longer exhibited the disadvantages of the prior art compositions such as discoloration, darkening and decomposition upon exposure to oxygen so that they could be easily prepared, stored, transported, handled and used even after prolonged storage without loss of cleaning and/or stripping power and without causing erroneous outputs of the sensors associated with the fabrication processing tools, which outputs compromised the function and reliability of the processing tools.

The compositions of the invention were most particularly well-suited for carrying out the above-mentioned cleaning steps, in particular, the post-CMP cleaning of semiconductor wafers and the fabrication of ICs with LSI or VLSI, in particular by the copper damascene or dual damascene process.

The compositions of the invention removed most efficiently all kinds of residues and contaminants generated during the substrate surface preparation, deposition, plating, etching and CMP and ensured that the substrates, in particular the ICs, were free from residues and contaminants that would have otherwise deleteriously affected the functions of the electrical and optical devices, in particular the ICs, or would have rendered them even useless for their intended functions. In particular, they prevented the scratching, etching and roughening of the copper metallization in damascene structures.

Moreover, the compositions of the invention removed such residues and contaminants most efficiently not only from the substrates but also from processing tools used in the various fabrication processes.

It was most particularly surprising that the methods of the invention were most excellently suited for fabricating electrical devices, in particular, semiconductor integrated circuits (ICs); liquid crystal panels; organic electroluminescent panels; printed circuit boards; micro machines; DNA chips; micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

In particular, the methods of the invention were most excellently suited for the fabrication of electrical and optical devices, in particular electrical devices, which fabrication involved surface preparation, pre-plaiting cleaning, post-etch cleaning and/or post-CMP cleaning steps, more particularly post-etch and/or post-CMP cleaning steps, and, most particularly, post-CMP cleaning steps.

The methods of the invention were most particularly well-suited for the fabrication of ICs with LSI or VLSI, especially with the help of the copper damascene and dual damascene process. Regarding the copper damascene and dual damascene process, the methods of the invention removed contaminants and residues such as particles containing or consisting of copper, copper oxide, copper-inhibitor complexes, abrasives and carbon after the CMP steps from the substrate surfaces, the polishing pads and other processing tools most efficiently without scratching, etching and roughening the copper surfaces.

DETAILED DESCRIPTION OF THE INVENTION

In its broadest aspect the present invention relates to the compositions of the invention. The compositions of the invention are aqueous alkaline cleaning compositions for processing substrates useful for fabricating electrical and optical devices.

"Aqueous" means that the compositions of the invention contain water. The water content can vary broadly from competition to composition.

"Alkaline" means that the compositions of the invention have a pH in the range of from 8 to 14, preferably 9 to 13 and, most preferably, 8.5 to 12.5.

The compositions of the invention comprise as the first essential component at least one, preferably one thioamino acid (A) having at least one, preferably one secondary or tertiary amino group and at least one, preferably one mercapto group. The thioamino acid (A) may be derived from a synthetic or naturally occurring, preferably a naturally occurring amino acid. More preferably, the thioamino acid (A) is an alpha-amino acid. Even more preferably, the mercapto group of the thioamino acid (A) is in the gamma-position. Most preferably, the thioamino acid (A) is an alpha-amino acid having the mercapto group in the gamma-position.

Examples for synthetic thioamino acids the thioamino acids (A) can be derived from, are known from the international patent application WO 02/22568, page 13, line 9, to page 16, line 12.

Most particularly preferably, the thioamino acid (A) has the general formula I:

$$\text{HS}-[-\text{C}(-R^1)(-R^2)-]_n-\text{C}[-N(-R^3)(-R^4)](-R^5)-\text{COOH} \qquad (I).$$

In the general formula I the index n is an integer of 1 to 3, preferably 1 or 2. Most preferably, n equals 1.

The residues $R^1$ and $R^2$ of the general formula I are selected independently from each other from the group consisting of
  hydrogen atoms;
  straight and branched, saturated and unsaturated, preferably saturated, substituted and unsubstituted, preferably unsubstituted aliphatic residues having 1 to 10 carbon atoms, preferably alkyl residues, in particular methyl, ethyl, propyl, isopropyl, n-butyl, isobutyl, sec-butyl, tert-butyl, pentyl, 1-methyl butyl, 2-methyl butyl, 3-methyl butyl, 1-ethyl propyl, 1,2-dimethyl propyl, 2,2-dimethyl propyl, hexyl, heptyl, octyl, iso-octyl, nonyl or decyl;
  substituted and unsubstituted, preferably unsubstituted, saturated and unsaturated, preferably saturated cycloalkyl residues having 3 to 8 carbon atoms, in particular cyclopropyl, cyclobutyl, cyclopentyl, cyclohexyl, cycloheptyl, cyclooctyl and residues derived from by bicyclo[2.2.1]cycloheptane or norcarane;
  substituted and unsubstituted, preferably unsubstituted, saturated and unsaturated, preferably saturated alkylcycloalkyl residues wherein the alkyl group is having from 1 to 4 carbon atoms and the cycloalkyl group is having from 3 to 8 carbon atoms, in particular residues derived from methyl-, ethyl-, propyl-, isopropyl- or butyl-substituted cyclopropane, cyclobutane or cyclohexane, pinane or bornane, which alkylcycloalkyl residues may be linked to the basic structure of the thioamino acid (A)

of the general formula I via a carbon atom of the alkyl group or via a carbon atom of the cycloalkyl group;

substituted and unsubstituted, preferably unsubstituted aryl residues having from 6 to 16 carbon atoms, in particular phenyl or naphthyl or residues derived from anthracene or phenanthrene;

substituted and unsubstituted, preferably unsubstituted alkylaryl residues wherein the alkyl group is having from 1 to 4 carbon atoms and the aryl group is having from 6 to 16 carbon atoms, in particular methyl-, ethyl-, propyl-, isopropyl- or butyl-substituted phenyl or naphthyl or residues derived from methyl-, ethyl-, propyl-, isopropyl- or butyl-substituted anthracene or phenanthrene which alkylaryl residues may be linked to the basic structure of the thioamino acid (A) of the general formula I via a carbon atom of the alkyl group or via a carbon atom of the aryl group;

substituted and unsubstituted, preferably unsubstituted cycloalkylaryl residues wherein the cycloalkyl group is having from 3 to 8 carbon atoms and the aryl group is having from 6 to 16 carbon atoms, in particular cyclopropyl-, cyclobutyl-, cyclopentyl-, cyclohexyl-substituted phenyl, which cycloalkylaryl residues may be linked to the basic structure of the thioamino acid (A) of the general formula I via a carbon atom of the cycloalkyl group or via a carbon atom of the aryl group;

substituted and unsubstituted, preferably unsubstituted heteroaryl residues having at least one hetero atom selected from the group consisting of oxygen, sulfur, nitrogen and phosphorus atoms, in particular residues derived from furane, xanthene, thiophene, pyrrole, imidazole, triazoles, tetrazole, pyridine, pyridazine, pyrimidine, pyrazene, triazines, tetrazines, indole, quinoline, isoquinoline, purine or phosphinine;

substituted and unsubstituted, preferably unsubstituted alkylheteroaryl residues wherein the alkyl group is having from 1 to 4 carbon atoms, in particular the alkyl groups described hereinbefore, and the heteroaryl group is having at least one hetero atom selected from the group consisting of oxygen, sulfur, nitrogen and phosphorus atoms, in particular the heteroaryl groups as described hereinbefore, which alkylheteroaryl residues may be linked to the basic structure of the thioamino acid (A) via a carbon atom of the alkyl group or via a carbon atom of the heteroaryl group;

substituted and unsubstituted, preferably unsubstituted cycloalkylheteroaryl residues wherein the cycloalkyl group is having from 3 to 8 carbon atoms, in particular the cycloalkyl groups as described hereinbefore, and the heteroaryl group is having at least one hetero atom selected from the group consisting of oxygen, sulfur, nitrogen and phosphorus atoms, in particular the heteroaryl groups as described herein before; and substituted and unsubstituted, preferably unsubstituted arylheteroaryl residues wherein the aryl group is having from 6 to 16 carbon atoms, in particular the aryl groups as described hereinbefore, and the heteroaryl group is having at least one hetero atom selected from the group consisting of oxygen, sulfur, nitrogen and phosphorus atoms, in particular the heteroaryl groups as described herein before.

The residue $R^3$ on the general formula I is a residue $R^1$ or, provided $R^1$ is not a hydrogen atom, a residue of the general formula II: $-L^1-R^1$; wherein $L^1$ is a bivalent linking group, which is stable in the presence of the quaternary ammonium hydroxide (B).

In the context of the present invention "stable" means that the bivalent linking group $L^1$ or other groups in discussion do not hydrolyze or hydrolyze only very slowly to a very small extent in the presence of the quaternary ammonium salt (B) so that the concentration of the hydrolyzation products is so low that they do not interfere with the function of the composition of the invention.

Preferably, the bivalent linking group $L^1$ is selected from the group consisting of:

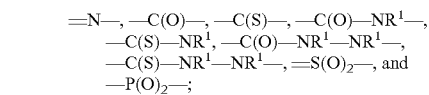

which groups are bonded to the nitrogen atom of the secondary or tertiary amino group via the nitrogen double bond, the carbon atom, the sulfur atom or the phosphorus atom and wherein the residue $R^1$ has the above-defined meaning.

The residue $R^4$ of general formula I is a residue $R^1$, except a hydrogen atom, or a residue of the general formula II as described above.

Alternatively, the residues $R^1$, $R^2$, $R^3$ and $R^4$ form at least one saturated or unsaturated, substituted or unsubstituted ring between at least two of the said residues, the said ring or rings having 3 to 6 carbon atoms. In the said ring or in at least one of the rings no carbon atom or 1 or 2 carbon atoms are replaced by one hetero atom selected from the group consisting of oxygen, sulfur, nitrogen and phosphorus atoms, in particular, oxygen and nitrogen atoms.

The residue $R^5$ of the general formula I is a single residue $R^1$ or a covalent bond or a bivalent linking group $L^2$, which is stable in the presence of the quaternary ammonium hydroxide (B) in the above-mentioned sense, linking the alpha-carbon atom carrying the amino group and the carboxyl group to one of the residues $R^1$, $R^2$, $R^3$ or $R^4$ or to the ring or to at least one of the rings formed by at least two of the residues $R^1$, $R^2$, $R^3$ and $R^4$.

Examples for such rings between various residues $R^1$ to $R^5$ can be symbolized as follows:
$R^1$—$R^2$, $R^1$—$R^3$, $R^1$—$R^4$, $R^1$—$R^5$;
$R^2$—$R^3$, $R^2$—$R^4$, $R^2$—$R^5$;
$R^3$—$R^4$, $R^3$—$R^5$; or
$R^4$—$R^5$;
$R^1$—$R^2$—$R^3$, $R^1$—$R^2$—$R^4$, $R^1$—$R^2$—$R^5$, $R^1$—$R^3$—$R^4$, $R^1$—$R^3$—$R^5$;
$R^2$—$R^4$—$R^3$, $R^2$—$R^4$—$R^5$, $R^2$—$R^5$—$R^3$; or
$R^4$—$R^4$—$R^3$.

Preferably, the bivalent linking group $L^2$ is selected from the group consisting of:

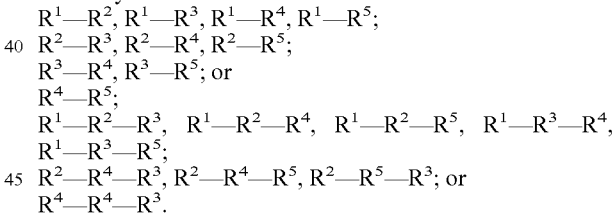

wherein the residue $R^1$ is having the above-described meaning.

Generally, the substituted residues $R^1$ to $R^5$ described above can contain any substituents as long as the substituents are stable in the above-mentioned sense and do not cause any unwanted reactions which could lead to the decomposition and/or the agglomeration and/or the formation of precipitates in or of the compositions of the invention. Preferably, the substituents are selected from the group consisting of:
—$OR^1$, —$C(O)$—$R^1$, —$COOR^1$, —$SO_3R^1$, —$P(O)_2R^1$, —$N(—R^1)_2$, —NR$^1$—C(O)(—R$^1$)$_2$;
—F, —Cl, —CN and —NO$_2$;
wherein the residue R$^1$ is having the above-described meaning.

The thioamino acids (A) of the general formula I can be racemic or enantiomeric mixtures which may be equimolar or non-equimolar, or one of the respective enantiomers or diastereomers.

More preferably, at least one of the residues R$^1$, R$^2$ and R$^5$ described above is a hydrogen atom. Even more preferably, all of the residues R$^1$, R$^2$ and R$^5$ are hydrogen atoms.

Particularly preferably, the residue R$^3$ is a hydrogen atom.

Therefore, most preferably, the thioamino acid (A) is derived from cysteine and homocysteine, in particular, cysteine, especially L-cysteine.

Even more preferably, the residue R$^4$ is of the general formula II-1:

wherein the residue R$^1$ is selected from straight and branched, saturated, substituted and unsubstituted aliphatic residues having 1 to 10 carbon atoms, particularly from methyl, ethyl, propyl, isopropyl, n-butyl, isobutyl, sec-butyl, tert-butyl, pentyl, 1-methyl butyl, 2-methyl butyl, 3-methyl butyl, 1-ethyl propyl, 1,2-dimethyl propyl, 2,2-dimethyl propyl, hexyl, heptyl, octyl, iso-octyl, nonyl or decyl, especially methyl.

Therefore, the thioamino acid (A) of the general formula I most particularly preferably used is N-acetylcysteine.

The compositions of the invention comprise as the second essential component at least one, preferably one quaternary ammonium hydroxide (B). More preferably, the quaternary ammonium hydroxide (B) has the general formula III:

In the general formula II, the residue R$^1$ is having the above defined meaning except hydrogen atom, whilst all the residues R$^1$ are the same or at least two residues R$^1$ are different from each other and all the residues R$^1$ are single residues or at least two residues R$^1$ form a saturated or unsaturated, substituted or unsubstituted ring having 3 to 6 carbon atoms, wherein no carbon atom or 1 or 2 carbon atoms are replaced by one hetero atom selected from the group of oxygen, sulfur, nitrogen and phosphorus atoms.

More preferably, the residue R$^1$ of the general formula II is selected from the group consisting of straight and branched, substituted and unsubstituted, saturated aliphatic residues having 1 to 10, in particular, 1 to 4 carbon atoms.

In the case that the quaternary ammonium hydroxide (B) of the general formula II only contains residues R$^1$ which are unsubstituted and saturated, all residues R$^1$ are preferably the same.

In the case that the quaternary ammonium hydroxide (B) of the general formula II contains residues R$^1$ which are a substituted and saturated, it is preferred that only one of the residues R$^1$ is substituted.

Particularly preferably, the quaternary ammonium hydroxide (B) of the general formula II contains methyl, ethyl, propyl, isopropyl, n-butyl, sec-butyl, iso-butyl, tert-butyl, n-pentyl, 2-hydroxyethyl, 2- and 3-hydroxypropyl and/or 4-hydroxy-n-butyl groups, in particular, methyl and/or 2-hydroxyethyl groups.

Most particularly preferably, tetramethylammonium hydroxide (TMAH) and/or choline, especially TMAH, is or are used.

Optionally, the compositions of the invention can contain at least one functional additive (C) which is different from the essential components (A) and (B). Preferably, the functional additive (C) is selected from the group consisting of corrosion inhibitors, bases, organic solvents, alcohols having at least one mercapto group, complexing or chelating agents, film-forming agents, surfactants, pH-adjusting agents, and metal free silicates.

Such functional additives (C) are described, for example, in the American U.S. Pat. No. 6,465,403 B1, column 7, line 1 to column 8, line 65; U.S. Pat. No. 6,200,947 B1, column 2, lines 29 to 40, U.S. Pat. No. 6,194,366 B1, column 3, lines 55 to 60, U.S. Pat. No. 6,492,308 B1, column 3, lines 1 to 9, and U.S. Pat. No. 6,767,476 B2, column 3, lines 45 to 67, and the American patent application US 2005/0181961 A1, page 2, paragraph [0019].

More preferably, the compositions of the invention contain least one complexing or chelating film-forming and/or corrosion inhibiting agent (C) selected from the group consisting of aliphatic and cycloaliphatic amines having at least two, preferably two primary amino groups, aliphatic and cycloaliphatic amines having at least one, preferably one hydroxy group, and aromatic compounds having at least one, preferably one acid group, in particular at least one, preferably one carboxylic acid group, and at least one, preferably one hydroxy group, and nitrogen containing cyclic compounds.

Preferably, the aliphatic amine (C) having at least two primary amino groups is selected from the group consisting ethylenediamine, propylenediamine, n-butylenediamine, diethylenetriamine, dipropylenetriamine, di-n-butylenetriamine, triethylenetetraamine, tripropylenetetraamine, and tri-n-butylenetetraamine, more preferably ethylenediamine, diethylenetriamine and triethylenetetraamine, most preferably ethylenediamine and diethylenetriamine.

Preferably, the cycloaliphatic amine (C) is selected from the group consisting of 1,2-, 1,3- and 1,4-diamino cyclohexane;

Preferably, the aliphatic amine (C) having at least one hydroxy group is selected from the group consisting of ethanolamine, diethanolamine and triethanolamine, most preferably ethanolamine.

Preferably, the cycloaliphatic amine (C) having at least one hydroxy group is selected from the group consisting of 2-, 3- and 4-hydroxy cyclohexylamine.

Preferably, the aromatic compound (C) having at least one, preferably one carboxylic acid group and at least one, preferably one hydroxy group is selected from the group consisting of salicylic acid, 3- and 4-hydroxy phthalic acid, 2-hydroxy terephthalic acid, and 3-, 4-, 5- and 6-hydroxysalicylic acid, most preferably salicylic acid.

Particularly preferably, the chelating and/or corrosion inhibiting agent (C) is selected from the group consisting of ethylenediamine, diethylenetriamine, triethylenetetraamine, ethanolamine and salicylic acid.

Preferably, the nitrogen containing cyclic compound (C) is selected from the group consisting of imidazole, triazole, benzotriazole, benzimidazole and benzothiadiazole and their derivatives with hydroxy, amino, imino, carboxy, mercapto, nitro and alkyl substituents, in particular 1,2,4-triazole.

Even more preferably, the compositions of the invention furthermore contain at least one, preferably one organic solvent (C) having wetting properties and melting point below 0° C.

As is known and the art, a solvent having wetting properties comprises a hydrophilic and a hydrophobic structural element so that the solvent is capable of lowering the surface tension of solids and liquids.

Generally, any organic solvent (C) having the above-mentioned properties can be used, as long as it is stable in the above-mentioned sense and does not cause the decomposition and/or precipitation and/or agglomeration of one of the other components of the compositions of the invention.

Preferably, the organic solvent (C) is selected from the group consisting of polyalkylene glycol mono ethers. More preferably, the polyalkylene glycol mono ether (D) is of the general formula III:

$$HO-(-R^6-O-)_m-R^1 \qquad (IV),$$

wherein the variables and the index have the following meaning:

m integer of from 2 to 6, preferably 2 to 4, more preferably 2 or 3 and most preferably 2;

$R^1$ as defined above, except hydrogen atom; and $R^6$ alkylene group having 2 to 4, preferably 2 or 3 and, most preferably, 2 carbon atoms.

More preferably, the polyalkylene glycol mono ether (C) of the general formula IV is selected from the group consisting of diethylene glycol monomethyl, monoethyl, mononpropyl and mono-n-butyl ether, most preferably diethylene glycol mono-n-butyl ether.

Even more preferably, the surfactant (C) is a nonionic surfactant (C). Preferably, the nonionic surfactant (C) is selected from the group consisting of acetylenic alcohols, ethoxylated acetylenic alcohols, fluorinated alkyesters, fluorinated polyoxyethylene alkanols, aliphatic acid esters of polyhydric alcohols, polyoxyethylene monoalkyl ethers, polyoxyethylene diols, polyoxyethylene esters, siloxane type surfactants and alkylene glycol monoalkyl ethers, more preferably, acetylenic alcohols, most preferably 3,5 dimethyl-1-hexyn-3-ol, and polyoxyethylene esters, most preferably polyoxyethylene sorbitan monolaurate.

Even more preferably, the pH-adjusting agent (C) is selected from the group of aliphatic carboxylic acids, preferably formic acid, acetic acid, propionic acid, lactic acid, tartaric acid and citric acid.

The compositions of the invention can contain the essential components (A) and (B) and optionally (C) in broadly varying amounts. Thus, the compositions of the invention can be highly concentrated solutions which contain only small amounts of water.

Preferably, the compositions of the invention are diluted or highly diluted aqueous compositions, i.e., they contain more than 50% by weight, more preferably more than 75% by weight and, most preferably, more than 90% by weight of water, each weight percentage being based on a complete weight of a composition of the invention.

More preferably, the compositions of the invention contain
0.1 to 20% by weight, even more preferably 0.1 to 15% by weight and, most preferably, 0.1 to 2% by weight of the component (A) and
0.1 to 20% by weight, even more preferably 0.1 to 15% by weight and, most preferably, 0.1 to 2% by weight of the component (B).

the weight percentages being based on the complete weight of a composition of the invention.

The amounts of the optional functional additive or additives (C) can also vary broadly. Preferably, the customary amounts known from the prior art cited above are used.

More preferably, the complexing or chelating, film-forming and/or corrosion inhibiting agent (C) is used in amounts of from 0.1 to 10% by weight, even more preferably 0.1 to 9% by weight and, most preferably, 0.1 to 8% by weight, each weight percentage being based on the complete weight of a composition of the invention.

More preferably, the organic solvent (C) is used in amounts of from 1 to 10% by weight, even more preferably 2 to 7.5% by weight and, most preferably, 3 to 7.5% by weight of the component (D), each weight percentage being based on the complete weight of a composition of the invention.

More preferably, the surfactant (C) is used in amounts of from 0.001 to 3% by weight, even more preferably 0.005 to 2.5% by weight and most preferably 0.005 to 2% by weight, each weight percentage being based on the complete weight of a composition of the invention.

More preferably, the pH-adjusting agent is used in amounts of from 0.01 to 3% by weight, even more preferably 0.01 to 2.5% by weight and most preferably 0.01 to 2% by weight, each weight percentage being based on the complete weight of a composition of the invention.

The compositions of the invention can be prepared by customary and standard mixing processes and mixing apparatuses such as agitated vessels, in-line dissolvers, high shear impellers, ultrasonic mixers, homogenizer nozzles or counterflow mixers, can be used for carrying out the mixing of the components of the compositions in the desired amounts.

The compositions of the invention are excellently suited for the methods of the invention.

Moreover, the compositions of the invention are also excellently suited for cleaning all kinds of processing tools such as polishing pads, sensors, nozzles, pipes and/or structural features of the equipment used, which tools come into contact with other processing liquids used in fabricating electrical or optical devices.

The main purpose of the methods of the invention however is the processing of substrates useful for fabricating electrical devices, in particular, semiconductor integrated circuits (ICs); liquid crystal panels; organic electroluminescent panels; printed circuit boards; micro machines; DNA chips; micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

It is essential that the methods of the invention make use of at least one composition of the invention in at least one process step.

Preferably, the methods of the invention involve surface preparation, pre-plaiting cleaning, post-etch cleaning and/or post-CMP cleaning steps, in particular post-CMP cleaning steps.

The methods of the invention are particularly well-suited for the processing of substrates useful for fabricating ICs with LSI or VLSI, in particular in the back end of the line processing (BEOL).

The methods of the invention are most particularly well-suited for the post-CMP cleaning of semiconductor wafers in the fabrication of ICs with LSI or VLSI, in particular by the copper damascene or dual damascene process.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the CMP agent (A), in particular, the CMP agent of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

After the CMP step, the surface of the semiconductor wafer is contacted with a composition of the invention for a time and a temperature sufficient to clean the unwanted contaminants and residues from the substrate surface. Optionally, the substrate is rinsed to remove the composition of the invention and the contaminants and residues and dried to remove any excess solvents or rinsing agents.

Preferably, the methods of the invention use a bath or a spray application to expose the substrate to the composition. Bath or spray cleaning times are generally one minute to 30 minutes, preferably 5 minutes to 20 minutes. Bath or spray cleaning temperatures are generally 10° C. to 90° C., preferably 20° C. to 50° C. However, megasonics and ultrasonic, preferably megasonics cleaning methods can also be applied.

If required, the rinse times are generally 10 seconds to 5 minutes at room temperature, preferably 30 seconds to 2 minutes at room temperature. Preferably, deionized water is used to rinse the substrates.

If required, the drying of the substrates substrates can be accomplished using any combination of air-evaporation, heat, spinning or pressurized gas. The preferred drying technique is spinning under a filtered inert gas flow, such as nitrogen, for a period of time until the substrate is dry.

EXAMPLES

Examples 1 and 2 and Comparative Experiment C1

The Preparation of Aqueous Alkaline Cleaning Compositions Containing N-Acetylcysteine (Examples 1 and 2) and not Containing N-Acetylcysteine (Comparative Experiment C1)

The aqueous alkaline cleaning compositions of the examples 1 and 2 and the comparative experiment C1 were prepared by mixing their ingredients and homogenizing the resulting mixtures. The Table 1 summarizes their compositions.

TABLE 1

The Compositions of the Aqueous Alkaline Cleaning Compositions (Balance: Water)

| Example | TMAH[a]/ % by weight | EDA[b]/% by weight | DEGBE[c]/% by weight | N-acetylcysteine/% by weight |
|---------|---------------------|--------------------|--------------------|------------------------------|
| 1  | 1.5 | 1 | 5 | 1.6 |
| 2  | 1.5 | 1 | 5 | 1.6 |
| C1 | 1.5 | 1 | 5 | —   |

[a] tetramethylammonium hydroxide;
[b] ethylenediamine;
[c] diethylene glycol monobutyl ether.

The compositions of the examples 1 and 2 were stable even upon prolonged exposure to oxygen.

Examples 3 and 4 and Comparative Experiment C2

The Etching Rates of the Aqueous Alkaline Compositions of the Examples 1 and 2 (Examples 3 and 4) and of the Comparative Experiment C1 (Comparative Experiment C2)

The composition of the example 1 was used for the example 3; the composition of the example 2 was used for the example 4; and the composition of the comparative experiment C1 was used for the comparative experiment C2.

The etching rates were measured by the 4-point probe (Napson) method and confirmed by the atomic force microscopy (AFM).

To this end, pieces of electroless copper deposit (ECD) wafers were immersed in the various aqueous alkaline cleaning compositions at room temperature for 1 hour (4-point probe measurements) or 1 minute (AFM measurements). Thereafter, the ECD wafers were taken from the compositions, rinsed with water and dried in a nitrogen stream at room temperature. Whereas the ECD wafers of the examples 3 and 4 were not etched and showed only a very small change in their surface roughness in the range of 0.1 nm, the ECD wafers of the comparative experiment C1 showed an etching rate of 17.9 Å/minute (1.79 nm/minute) and a significant increase of their surface roughness.

Examples 5 and 6 and Comparative Experiment C3

The Cleaning Efficacy of the Aqueous Alkaline Cleaning Compositions of the Examples 1 and 2 (Examples 5 and 6) in Comparison with Deionized Water (Comparative Experiment C3)

The composition of the example 1 was used for the example 5; and the composition of the example 2 was used for the example 6. Deionized water was used for the comparative experiment C3.

The cleaning efficacy of the aqueous alkaline cleaning compositions was tested as follows. ECD copper wafer pieces were contaminated with CMP agents containing silica particles having a mean primary particle diameter of 30 nm as measured with the laser light scattering method. Thereafter, the contaminated ECD copper wafer pieces were treated with the compositions of the example 1 or 2 and, for purposes of comparison, with deionized water for one minute each. Thereafter, the surfaces of the treated ECD copper wafer pieces were checked for particle residues by scanning electron microscopy (SEM). Whereas the surfaces of the ECD copper wafer pieces treated with the compositions of the examples 1 and 2 were free from silica particles, the surfaces of the ECD copper wafer pieces treated with deionized water were still covered with considerable amounts of silica particles.

Examples 7 to 10

The Preparation of Aqueous Alkaline Cleaning Compositions Containing N-Acetylcysteine The aqueous alkaline cleaning compositions of the examples 7 to 10 were prepared by mixing their ingredients and homogenizing the resulting mixtures. The Table 2 summarizes their compositions.

TABLE 2

The Compositions of the Aqueous Alkaline Cleaning Compositions (Balance: Water)

| Example | TMAH$^{a)}$/ % by weight | DETA$^{b)}$/ % by weight | N-acetyl-cysteine/% by weight | Surfactant | Film-forming Agent$^{e)}$ | pH-adjusting agent$^{f)}$ |
|---|---|---|---|---|---|---|
| 7 | 10 | 7 | 8 | 0.2$^{c)}$ | 2 | 1.5 |
| 8 | 0.5 | 0.35 | 0.4 | 0.01$^{c)}$ | 0.1 | 0.07 |
| 9 | 10 | 7 | 8 | 0.2$^{d)}$ | 2 | 1.5 |
| 10 | 0.5 | 0.35 | 0.4 | 0.01$^{d)}$ | 0.1 | 0.07 |

$^{a)}$tetramethylammonium hydroxide;
$^{b)}$diethylenetriamine;
$^{c)}$3,5-dimethyl-1-hexyn-3-ol;
$^{d)}$polyoxyethylene sorbitan laurate;
$^{e)}$1,2,4-triazole;
$^{f)}$citric acid.

The concentrated compositions of the examples 7 and 9 were stable even upon prolonged exposure to oxygen. Therefore, they could be most advantageously manufactured, stored, handled and shipped. Thus, it was possible to deliver the concentrated compositions most economically to the customer who could easily dilute them before use.

The diluted compositions of the examples 8 and 10 were likewise stable even upon prolonged exposure to oxygen and exhibited a particularly high cleaning efficacy with only a very small change of the surface roughness during the cleaning of copper surfaces. Compositions containing ethylenediamine instead of diethylenetriamine exhibited the same advantageous properties and effects.

The invention claimed is:

1. An aqueous alkaline composition, comprising:
   (A) a thioamino acid comprising a secondary or tertiary amino group and a mercapto group;
   (B) a quaternary ammonium hydroxide; and
   (C) at least one functional additive selected from the group consisting of a complexing agent, a chelating agent, a corrosion inhibiting agent, a film-forming agent, a base, an organic solvent, an alcohol comprising a mercapto group, a surfactant, a pH-adjusting agent, and a metal free silicate.

2. The composition of claim 1, wherein the thioamino acid (A) is an alpha-amino acid.

3. The composition of claim 2, wherein the thioamino acid (A) has a formula (I):

$$\text{HS}-\left[\begin{array}{c}R^1\\|\\|\\R^2\end{array}\right]_n\begin{array}{c}R^3\\|\\N\\|\\R^5\end{array}\begin{array}{c}R^4\\\\\\\\\end{array}\begin{array}{c}O\\||\\\\\\OH,\end{array} \quad (I)$$

wherein
n is a integer of 1 to 3,
R$^1$ and R$^2$ are each independently a hydrogen or a residue selected from the group consisting of
   a straight aliphatic residue comprising 1 to 10 carbon atoms,
   a branched aliphatic residue comprising 1 to 10 carbon atoms,
   a cycloalkyl residue comprising 3 to 8 carbon atoms,
   an alkylcycloalkyl residue wherein the alkyl group comprises from 1 to 4 carbon atoms and the cycloalkyl group comprises from 3 to 8 carbon atoms,
   an aryl residue comprising from 6 to 16 carbon atoms,
   an alkylaryl residue wherein the alkyl group comprises from 1 to 4 carbon atoms and the arylgroup comprises from 6 to 16 carbon atoms,
   a cycloalkylaryl residue wherein the cycloalkyl group comprises from 3 to 8 carbon atoms and the arylgroup comprises from 6 to 16 carbon atoms,
   a heteroaryl residue comprising at least one hetero atom selected from the group consisting of oxygen, sulfur, nitrogen, and phosphorus,
   an alkylheteroaryl residue wherein the alkyl group comprises from 1 to 4 carbon atoms and the heteroaryl group comprises at least one hetero atom selected from the group consisting of oxygen, sulfur, nitrogen, and phosphorus,
   a cycloalkylheteroaryl residue wherein the cycloalkyl group comprises from 3 to 8 carbon atoms and the heteroaryl group comprises at least one hetero atom selected from the group consisting of oxygen, sulfur, nitrogen, and phosphorus, and
   an arylheteroaryl residue wherein the aryl group comprises from 6 to 16 carbon atoms and the heteroaryl group comprises at least one hetero atom selected from the group consisting of oxygen, sulfur, nitrogen, and phosphorus,
wherein the aliphatic, cycloalkyl, and alkylcycloalkyl residues are saturated or unsaturated, and each residue is optionally substituted,
R$^3$ is a residue of R$^1$ or hydrogen, provided that when R$^1$ is not hydrogen, R$^3$ is a residue of formula (II):

$$-L^1-R^1 \quad (II),$$

wherein L$^1$ is a bivalent linking group, which is stable in the presence of the quaternary ammonium hydroxide (B),
R$^4$ is a residue of R$^1$ or a residue of formula (II),
or, alternatively,
R$^1$, R$^2$, R$^3$ and R$^4$ form at least one saturated or unsaturated, optionally substituted, ring comprising 3 to 6 carbon atoms between at least two of the residues R$^1$, R$^2$, R$^3$, and R$^4$, wherein between 0 to 2 atoms in the ring are replaced with one hetero atom selected from the group consisting of oxygen, sulfur, nitrogen, and phosphorus,
R$^5$ is a hydrogen, a residue of R$^1$, a covalent bond, or a bivalent linking group L$^2$, which is stable in the presence of the quaternary ammonium hydroxide (B), linking the alpha-carbon atom comprising the amino group and the carboxyl group to one of the residues $R^1$, $R^2$, $R^3$, or $R^4$ or to the ring formed by at least two of the residues $R^1$, $R^2$, $R^3$, and $R^4$.

4. The composition of claim 3, wherein, in formula (II), L' is =N—, —C(O)—, —C(S)—, —C(O)—$NR^1$—, —C(S)—$NR^1$, —C(O)—$NR^1$—$NR^1$—, —C(S)—$NR^1$—$NR^1$—, —S(O)$_2$—, or —P(O)$_2$—, and
$L^1$ bonds to the nitrogen atom of the secondary or tertiary amino group via the nitrogen double bond, the carbon atom, the sulfur atom, or the phosphorus atom.

5. The composition of claim 4, wherein, in formula (II), $L^1$ is —C(O)—.

6. The composition of claim 3, wherein $L^2$ is —O—, —C(O)—, —C(S)—, —C(O)—O—, —O—C(O)—O—, —O—C(S)—O—, —$NR^1$—, =N—, —N=N—, —$NR^1$—C(O)—, —$NR^1$—$NR^1$—C(O)—, —$NR^1$—$NR^1$—C(S)—, —O—C(O)—$NR^1$—, —O—C(S)—$NR^1$—, —$NR^1$—C(O)—$NR^1$—, —$NR^1$—C(S)—$NR^1$—, —S—, —S(O)—, —S(O)$_2$—, —O—S(O)$_2$—, or —$NR^1$—S(O)$_2$—.

7. The composition of claim 3, wherein the thioamino acid (A) is a racemic or an enantiomeric mixture or an enantiomer or diastereomer of the compound of formula (I).

8. The composition of claim 3, wherein, in formula (I), at least one of $R^1$, $R^2$, and $R^5$ is a hydrogen.

9. The composition of claim 8, wherein, in formula (I), $R^1$, $R^2$, and $R^5$ are a hydrogen.

10. The composition of claim 8, wherein, in formula (I), $R^3$ is a hydrogen.

11. The composition if claim 10, wherein $R^4$ has a formula (II-1):

—C(O)—$R^1$ (II-1), wherein $R^1$ is straight or branched saturated aliphatic residue comprising 1 to 10 carbon atoms which is optionally substituted.

12. The composition of claim 11, wherein, in formula (II-1), $R^1$ is a methyl, an ethyl, a propyl, an isopropyl, a n-butyl, an isobutyl, a sec-butyl, a tert-butyl, a pentyl, a 1-methyl butyl, a 2-methyl butyl, a 3-methyl butyl, a 1-ethyl propyl, a 1,2-dimethyl propyl, a 2,2-dimethyl propyl, a hexyl, a heptyl, an octyl, an iso-octyl, a nonyl, or a decyl.

13. The composition of claim 12, wherein, in formula (II-1), $R^1$ is a methyl.

14. The composition of claim 13, wherein the thioamino acid (A) is N-acetylcysteine.

15. The composition of claim 3, wherein the quaternary ammonium hydroxide (B) has a formula (III):

$N(—R^1)_4{}^+OH^-$ (III), wherein, in formula (III), $R^1$ is not hydrogen, and either
every $R^1$ is the same,
at least two $R^1$ residues are different and the others are a single residue, or
at least two $R^1$ residues form a saturated or unsaturated, optionally substituted, ring comprising 3 to 6 carbon atoms, wherein between 0 to 2 carbon atoms are replaced with one hetero atom selected from the group of oxygen, sulfur, nitrogen, and phosphorus.

16. The composition of claim 15, wherein, in formula (III), $R^1$ is a methyl, an ethyl, a propyl, an isopropyl, a n-butyl, a sec-butyl, an iso-butyl, a tert-butyl, a n-pentyl, a 2-hydroxyethyl, a 2-hydroxypropyl, a 3-hydroxypropyl, or a 4-hydroxy-n-butyl.

17. The composition of claim 16, wherein, in formula (III), $R^1$ is a methyl.

18. The composition of claim 1, wherein at least one selected from the group consisting of the complexing agent, the chelating agent, the film forming agent, and the corrosion inhibiting agent is selected from the group consisting of an aliphatic amine comprising at least two primary amino groups, a cycloaliphatic amine comprising at least two primary amino groups, an aliphatic amine comprising a hydroxy group, cycloaliphatic amine comprising a hydroxy group, an aromatic compound comprising an acid group and a hydroxy group, and nitrogen comprising cyclic compound,
the surfactant is a nonionic surfactant,
the pH-adjusting agent is an aliphatic carboxylic acid, and
the organic solvent is an organic solvent having wetting properties and a melting point below 0° C.

19. The composition of claim 1, wherein a content of component (A) is 0.1 to 20% by weight and a content of component (B) is 0.1 to 20% by weight, based on a total weight of the composition.

20. The composition of claim 1, wherein a content of component (A) is 0.1 to 20% by weight, a content of component (B) is 0.1 to 20% by weight, and a content of component (C) is 0.001 to 3% by weight, based on a total weight of the composition.

21. A method for processing a substrate, the method comprising:
contacting, at least once, a substrate surface with a composition of claim 1.

22. The method of claim 21, wherein the contacting comprises at least one selected from the group consisting of a surface preparation, a pre-plating cleaning, a post-etch cleaning, and a post-chemical polish cleaning.

23. The method of claim 22, wherein the substrate is suitable for use in an electrical device selected from the group consisting of a semiconductor integrated circuit (ICs), a liquid crystal panels, an organic electroluminescent panel, a printed circuit board, a micro machine, a DNA chip, a micro plant, and a magnetic head, or
an optical device selected from the group consisting of an optical glass, an inorganic electro-conductive film, an optical integrated circuit, an optical switching element, an optical waveguide, an optical monocrystal, a solid laser monocrystal, a blue LED sapphire substrate, a semiconductor monocrystal, and a magnetic disk glass substrate.

24. A method for producing an electrical or optical device, the method comprising:
combining a substrate obtained by the method of claim 21 with a component of an electrical or optical device.

25. A method for producing an electrical or optical device, the method comprising:
combining a substrate obtained by the method of claim 22 with a component of an electrical or optical device.

* * * * *